(12) United States Patent
Kang et al.

(10) Patent No.: US 8,633,579 B2
(45) Date of Patent: Jan. 21, 2014

(54) MULTI-CHIP PACKAGE AND METHOD OF MANUFACTURING THE SAME

(75) Inventors: Un-Byoung Kang, Hwaseong-si (KR); Jong-Joo Lee, Suwon-si (KR); Yong-Hoon Kim, Suwon-si (KR); Tae-Hong Min, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

(21) Appl. No.: 13/208,455

(22) Filed: Aug. 12, 2011

(65) Prior Publication Data

US 2012/0049352 A1 Mar. 1, 2012

(30) Foreign Application Priority Data

Aug. 25, 2010 (KR) .................. 10-2010-0082237

(51) Int. Cl.
*H01L 23/02* (2006.01)

(52) U.S. Cl.
USPC .......................... 257/686; 257/777; 257/724

(58) Field of Classification Search
USPC ................. 257/686, 777, 706, 707, 723, 724
See application file for complete search history.

(56) References Cited

U.S. PATENT DOCUMENTS

| 7,015,572 | B2 * | 3/2006 | Yamaji | 257/686 |
| 7,042,077 | B2 * | 5/2006 | Walk et al. | 257/686 |
| 7,531,905 | B2 | 5/2009 | Ishino et al. | |
| 7,863,735 | B1 * | 1/2011 | Cho et al. | 257/723 |
| 8,349,649 | B2 * | 1/2013 | Kurita | 438/107 |
| 2007/0040261 | A1 * | 2/2007 | Hetzel et al. | 257/686 |
| 2007/0108583 | A1 * | 5/2007 | Shim et al. | 257/686 |
| 2009/0243072 | A1 * | 10/2009 | Ha et al. | 257/686 |

FOREIGN PATENT DOCUMENTS

| KR | 10-0721353 | 5/2007 |
| KR | 10-0874910 | 12/2008 |

* cited by examiner

*Primary Examiner* — S. V. Clark
(74) *Attorney, Agent, or Firm* — Stanzione & Kim, LLP

(57) ABSTRACT

A multi-chip package may include a package substrate, an interposer chip, a first semiconductor chip, a thermal dissipation structure and a second semiconductor chip. The interposer chip may be mounted on the package substrate. The first semiconductor chip may be mounted on the interposer chip. The first semiconductor chip may have a size smaller than that of the interposer chip. The thermal dissipation structure may be arranged on the interposer chip to surround the first semiconductor chip. The thermal dissipation structure may transfer heat in the first semiconductor chip to the interposer chip. The second semiconductor chip may be mounted on the first semiconductor chip. Thus, the heat in the first semiconductor chip may be effectively transferred to the interposer chip through the thermal dissipation line.

14 Claims, 3 Drawing Sheets

MULTI-CHIP PACKAGE AND METHOD OF MANUFACTURING THE SAME

CROSS-REFERENCE TO RELATED APPLICATIONS

This application claims priority under 35 USC §119 to Korean Patent Application No. 2010-82237, filed on Aug. 25, 2010 in the Korean Intellectual Property Office (KIPO), the contents of which are herein incorporated by reference in their entirety.

BACKGROUND OF THE INVENTION

1. Field of the Invention

Example embodiments relate to a multi-chip package and a method of manufacturing the same. More particularly, example embodiments relate to a multi-chip package including a plurality of semiconductor packages sequentially stacked, and a method of manufacturing the multi-chip package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

In order to increase a storage capacity of the semiconductor package, a multi-chip package including a plurality of the semiconductor chips sequentially stacked on a package substrate may have been widely developed. Further, when the semiconductor chip may have a size smaller than that of the package substrate, an interposer chip may be used for reducing an electrical connection length between the semiconductor chip and the package substrate.

When an active region of a lower semiconductor chip may be arranged on an upper surface of the lower semiconductor chip, the active region may make contact with an upper semiconductor chip. High heat generated from the active region of the lower semiconductor chip may not be readily transferred to the interposer chip.

Further, a power pad of the upper semiconductor chip may be connected with the interposer chip through a small conductive bump. Thus, a sufficient power may not be supplied to the upper semiconductor chip through the small conductive bump.

SUMMARY OF THE INVENTION

Example embodiments provide a multi-chip package capable of dissipating heat in a semiconductor device and receiving a sufficient power.

Example embodiments also provide a method of manufacturing the above-mentioned multi-chip package.

Additional aspects and advantages of the present general inventive concept will be set forth in part in the description which follows and, in part, will be obvious from the description, or may be learned by practice of the general inventive concept.

According to some example embodiments, there is provided a multi-chip package. The multi-chip package may include a package substrate, an interposer chip, a first semiconductor chip, a thermal dissipation structure and a second semiconductor chip. The interposer chip may be mounted on the package substrate. The first semiconductor chip may be mounted on the interposer chip. The first semiconductor chip may have a size smaller than that of the interposer chip. The thermal dissipation structure may be arranged on the interposer chip to surround the first semiconductor chip. The thermal dissipation structure may transfer heat in the first semiconductor chip to the interposer chip. The second semiconductor chip may be mounted on the first semiconductor chip.

In some example embodiments, the thermal dissipation structure may include an insulating layer and a thermal dissipation line. The insulating layer may be formed on the interposer chip to surround the first semiconductor chip. The thermal dissipation line may be built in the insulating layer. The thermal dissipation line may make contact with the interposer chip and the first semiconductor chip to form a thermal transfer path of the heat. The first semiconductor chip may have an active region arranged on an upper surface of the first semiconductor chip. The thermal dissipation line may make contact with the active region. The thermal dissipation line may include a metal line.

In some example embodiments, the multi-chip package may include a power line built in the thermal dissipation structure to electrically connect a power pad of the second semiconductor chip with the interposer chip.

In some example embodiments, the interposer chip may include interposer plugs and interposer bumps. The interposer plugs may be formed through the first semiconductor chip. The interposer plugs may have upper ends electrically making contact with the first semiconductor chip. The interposer bumps may be mounted on lower ends of the interposer plugs. The interposer bumps may be electrically connected to the package substrate.

In some example embodiments, the first semiconductor chip may include first plugs and first conductive bumps. The first plugs may be formed through the first semiconductor chip. The first plugs may have upper ends electrically making contact with the second semiconductor chip. The first conductive bumps may be mounted on lower ends of the first plugs. The first conductive bumps may be electrically connected to the interposer chip.

In some example embodiments, the second semiconductor chip may include second conductive bumps electrically connected to the first semiconductor chip.

In some example embodiments, the multi-chip package may further include a molding member formed on an upper surface of the package substrate to cover the interposer chip, the thermal dissipation structure and the second semiconductor chip.

In some example embodiments, the multi-chip package may further include external terminals mounted on a lower surface of the package substrate.

According to some example embodiments, there is provided a method of manufacturing a multi-chip package. In the method of manufacturing the multi-chip package, an interposer chip may be mounted on a package substrate. A first semiconductor chip may be mounted on the interposer chip. The first semiconductor chip may have a size smaller than that of the interposer chip. A thermal dissipation structure may be arranged on the interposer chip to surround the first semiconductor chip. A second semiconductor chip may be mounted on the first semiconductor chip.

In some example embodiments, forming the thermal dissipation structure may include forming an insulating layer on the interposer chip, and forming a thermal dissipation line in the insulating layer. The thermal dissipation line may make contact with the interposer chip and the first semiconductor chip to form a thermal transfer path of the heat.

In some example embodiments, forming the thermal dissipation structure may further include forming a power line in the insulating layer. The power line may be electrically connected between a power pad of the second semiconductor chip and the interposer chip.

In some example embodiments, the method may further include forming conductive bumps between the package substrate and the interposer chip, between the interposer chip and the first semiconductor chip, and between the first semiconductor chip and the second semiconductor chip.

In some example embodiments, the method may further include forming a molding member on an upper surface of the package substrate to cover the interposer chip, the thermal dissipation structure and the second semiconductor chip.

In some example embodiments, the method may further include mounting external terminals on a lower surface of the package substrate.

According to some example embodiments, the thermal dissipating line of the thermal dissipation structure may connect the first semiconductor chip with the interposer chip. Thus, the heat in the first semiconductor chip may be effectively transferred to the interposer chip through the thermal dissipation line. Further, the power line having a sufficient size may connect the power pad of the second semiconductor chip with the interposer chip. Therefore, a sufficient power may be supplied to the second semiconductor chip through the large power line.

According to some example embodiments, there is provided a multi-chip package including: an interposer chip; a first semiconductor chip electrically connected to an upper surface of the interposer chip, the first semiconductor chip including an active region formed at an upper surface thereof; and a thermal dissipation line extending from an upper surface of the interposer chip to surround a portion of the first semiconductor chip and connect to the active region of the first semiconductor chip to transfer heat in the first semiconductor chip to the interposer chip.

In an exemplary embodiment, the multi-chip package may further include a second semiconductor chip disposed over the active region of the first semiconductor chip and having a power pad thereon; and a power line extending from an upper surface of the interposer chip to surround a portion of the first semiconductor chip to connect with the power pad of the second semiconductor chip.

In an exemplary embodiment, the multi-chip package may further include a thermal dissipation structure including an insulating layer formed on an upper edge surface of the interposer chip to surround the first semiconductor chip.

In an exemplary embodiment, the insulating layer may comprise a first hole configured to receive the thermal dissipation line therein and a second hold configured to receive the power line therein.

In an exemplary embodiment, the interposer chip may include interposer plugs extending therethrough to connect at one end with the first semiconductor chip and at an opposite end with interposer bumps on a lower surface thereof to make an electrical connection with a semiconductor substrate.

In an exemplary embodiment, the first semi-conductor chip may include first plugs extending therethrough to connect at one end thereof with the one end of the interposer plugs and at another end with the second semi-conductor chip.

In an exemplary embodiment, the second semi-conductor chip comprises second conductive bumps on a lower side thereof to connect with respective ones of the first plugs of the first semi-conductor chip.

According to some example embodiments, there is provided a multi-chip package, including: an interposer chip mounted to a substrate; a first semiconductor chip electrically connected to an upper surface of the interposer chip and smaller in cross sectional area than the interposer chip, the first semiconductor chip including an active region formed at an upper surface thereof; and a thermal dissipation structure extending from an upper surface of the interposer chip and surrounding side portions of the first semiconductor chip, the thermal dissipation structure including a thermal dissipation line extending therethrough to connect to the activation region at one end and to the interposer chip at another end to transfer heat from the first semiconductor chip to the interposer chip.

In an exemplary embodiment, the multi-chip package may further include a second semiconductor chip mounted on the first semiconductor chip and including a power pad; and a power line extending through the thermal dissipation structure to connect to the power pad at one end and to the interposer chip at another end.

According to some example embodiments, there is provided a method of manufacturing a multi-chip package, the method includes mounting a first semiconductor chip on an upper surface of an interposer chip, the first semiconductor chip having a size smaller than that of the interposer chip; forming a thermal dissipation structure on the upper surface of the interposer chip to surround the first semiconductor chip; and mounting a second semiconductor chip on an upper surface of the first semiconductor chip.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
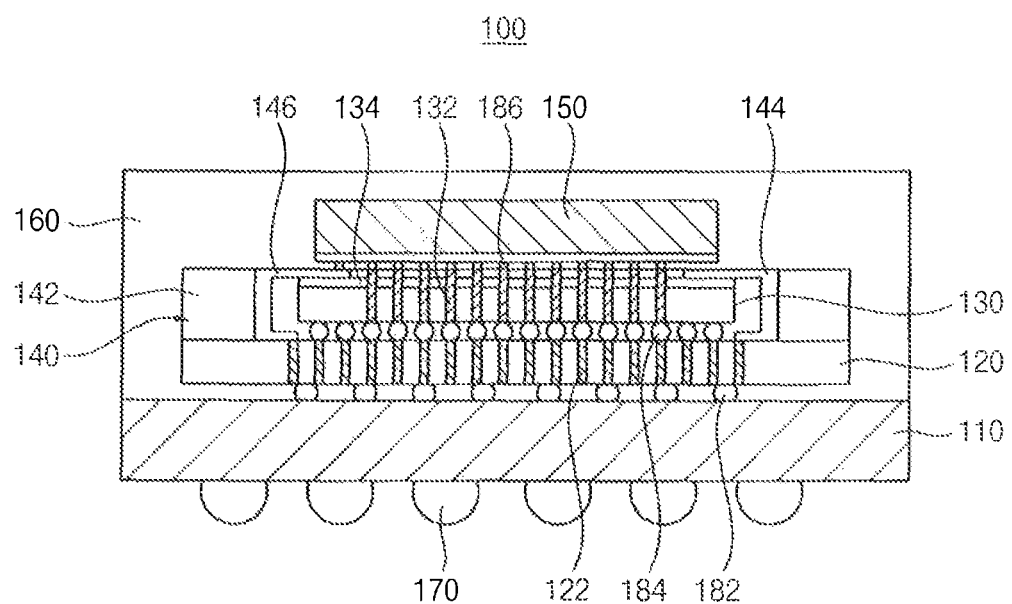
FIG. 1 is a cross-sectional view illustrating a multi-chip package in accordance with some example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Multi-Chip Package

FIG. 1 is a cross-sectional view illustrating a multi-chip package in accordance with some example embodiments.

Referring to FIG. 1, a multi-chip package 100 of this example embodiment may include a package substrate 110, an interposer chip 120, a first semiconductor chip 130, a thermal dissipation structure 140 a second semiconductor chip 150, a molding member 160 and external terminals 170.

The interposer chip 120 may be mounted on an upper surface of the package substrate 110. In some example embodiments, the interposer chip 120 may have a plurality of interposer plugs 122. The interposer plugs 122 may be vertically formed through the interposer chip 120.

Interposer bumps 182 may be interposed between the interposer chip 120 and the package substrate 110. In some example embodiments, the interposer bumps 182 may electrically connect lower ends of the interposer plugs 122 with pads (not shown) of the package substrate 110.

The first semiconductor chip 130 may be mounted on an upper surface of the interposer chip 120. In some example embodiments, the first semiconductor chip 130 may have a plurality of first plugs 132. The first plugs 132 may be vertically formed through the first semiconductor chip 130. The first semiconductor chip 130 may have an active region 134. The active region 134 may be positioned at an upper surface of the first semiconductor chip 130. Thus, the multi-chip package 100 of this example embodiment may correspond to a face-up type flip chip package.

First conductive bumps 184 may be interposed between the first semiconductor chip 130 and the interposer chip 120. In some example embodiments, the first conductive bumps 184 may be interposed between lower ends of the first plugs 132 and upper ends of the interposer plugs 122 to electrically connect the first plugs 132 with the interposer plugs 122.

In some example embodiments, the first semiconductor chip 130 may have a size smaller than that of the interposer chip 120. Thus, the first semiconductor chip 130 may have an area less than that of the interposer chip 120. Because the first semiconductor chip 130 may be arranged on an upper central surface of the interposer chip 120, an upper edge surface of the interposer chip 120 may be exposed.

The thermal dissipation structure 140 may be formed on the exposed upper edge surface of the interposer chip 120. The thermal dissipation structure 140 may be configured to surround the first semiconductor chip 130. The thermal dissipation structure 140 may transfer heat in the first semiconductor chip 130 to the interposer chip 120.

In some example embodiments, the thermal dissipation structure 140 may include an insulating layer 142 and a thermal dissipation line 144. The insulating layer 142 may be formed on the upper edge surface of the interposer chip 120. The insulating layer 142 may be configured to surround the first semiconductor chip 130. The thermal dissipation line 144 may be built into the insulating layer 142 such that it is insulated from external elements.

In some example embodiments, the insulating layer 142 may have an area substantially similar to that of the interposer chip 120. The insulating layer 142 may have a thickness slightly greater than that of the first semiconductor chip 130. The insulating layer 142 may have a first hole configured to receive the thermal dissipation line 144 therethrough to allow for connection to other components.

The thermal dissipation line 144 may be formed in the first hole of the insulating layer 142. The thermal dissipation line 144 may have a lower end making contact with the upper end of an interposer plug 122, and an upper end making contact with the active region 134 of the first semiconductor chip 130.

Thus, the heat in the active region 134 of the first semiconductor chip 130 may be rapidly transferred to the interposer plug 122 of the interposer chip 120 through the thermal dissipation line 144. In some example embodiments, the thermal dissipation line 144 may include a metal line.

The second semiconductor chip 150 may be mounted on an upper surface of the first semiconductor chip 130. In some example embodiments, the second semiconductor chip 150 may be electrically connected to upper ends of the first plugs 132 of the first semiconductor chip 130 via second conductive bumps 186.

In some example embodiments, any one among the second conductive bumps 186 may be connected to a power pad (not shown) of the second semiconductor chip 150. This second conductive bump 186 may be used for a power bump of the second semiconductor chip 150.

In order to supply a sufficient power to the second semiconductor chip 150, the thermal dissipation structure 140 may further include a power line 146. In some example embodiments, the insulating layer 142 may have a second hole configured to receive the power line 146. Thus, the power line 146 may have an upper end making contact with one of the second conductive bumps 186, and a lower end making contact with one of the interposer plugs 122 of the interposer chip 120. The power line 146 may have an area larger than that of the first plug 132. Therefore, a sufficient power may be supplied to the second semiconductor chip 150 through the large power line 146. The power line 146 may include a metal line.

The molding member 160 may be formed on the package substrate 110 to cover the interposer chip 120, the thermal dissipation structure 140 and the second semiconductor chip 150. The molding member 160 may protect the interposer chip 120, the thermal dissipation structure 140, the first semiconductor chip 130 and the second semiconductor chip 150 from external environments. In some example embodiments, the molding member 160 may include an epoxy molding compound (EMC).

The external terminals 170 may be mounted on a lower surface of the package substrate 110. The external terminals 170 may be electrically connected to the interposer bumps 182. In some example embodiments, the external terminals 170 may include solder balls.

Method of Manufacturing a Multi-Chip Package

FIGS. 2 to 6 are cross-sectional views illustrating an exemplary embodiment of a method of manufacturing the multi-chip package in FIG. 1.

Figure 2:
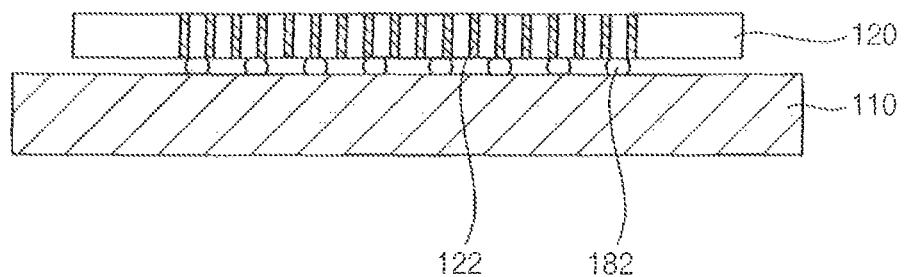
FIGS. 2 to 6 are cross-sectional views illustrating a method of manufacturing the multi-chip package in FIG. 1.

Referring to FIG. 2, the interposer chip 120 may be mounted on the upper surface of the package substrate 110 using the interposer bumps 182. The interposer bumps 182 may electrically connect the pads of the package substrate 110 with the lower ends of the interposer plugs 182 of the interposer chip 120.

Figure 3:
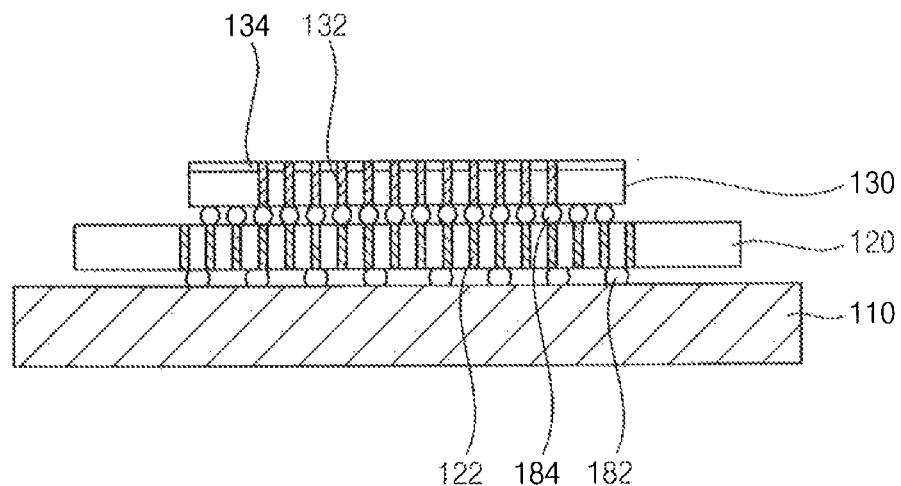

Referring to FIG. 3, the first semiconductor chip 130 may be mounted on the upper surface of the interposer chip 120 using the first conductive bumps 184. The first conductive bumps 184 may electrically connect the upper ends of the interposer plugs 122 with the lower ends of the first plugs 132 of the first semiconductor chip 130. In some example embodiments, the active region 134 of the first semiconductor chip 130 may be located at the upper surface of the first semiconductor chip 130. The first semiconductor chip, which may have a size smaller than that of the interposer chip 120, may be arranged on the upper central surface of the interposer chip 120. Thus, the upper edge surface of the interposer chip 120 may be exposed.

Figure 4:
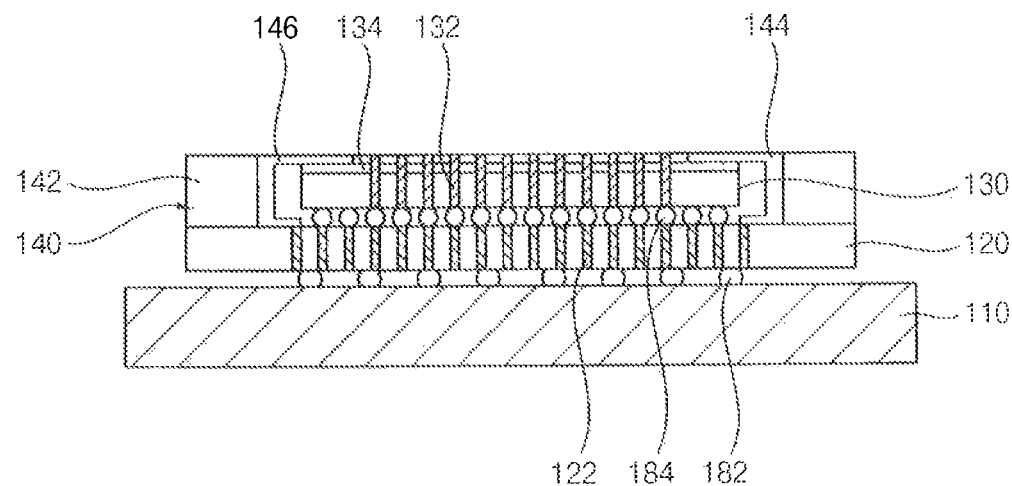

Referring to FIG. 4, the thermal dissipation structure 140 may be formed on the upper edge surface of the interposer chip 120. The thermal dissipation structure 140 may surround the first semiconductor chip 130.

In some example embodiments, the insulating layer 142 having the first hole and the second hole may be formed on the upper edge surface of the interposer chip 120 to surround the first semiconductor chip 130.

The thermal dissipation line 144 may be formed in the first hole. The thermal dissipation line 144 may electrically connect the active region 134 of the first semiconductor chip 130 with an interposer plug 122 of the interposer chip 120.

The power line 146 may be formed in the second hole. The lower end of the power line 146 may make contact with an interposer plug 122 of the interposer chip 120. The upper end of the power line 146 may be exposed through the insulating layer 142.

In some example embodiments, after mounting the interposer chip 120 on the package substrate 110, the first semiconductor chip 130 and the thermal dissipation structure 140 may be formed on the interposer chip 120. Alternatively, after forming the first semiconductor chip 130 and the thermal dissipation structure 140 on the interposer chip 120, the interposer chip 120 having the first semiconductor chip 130 and the thermal dissipation structure 140 may be mounted on the package substrate 110.

Figure 5:
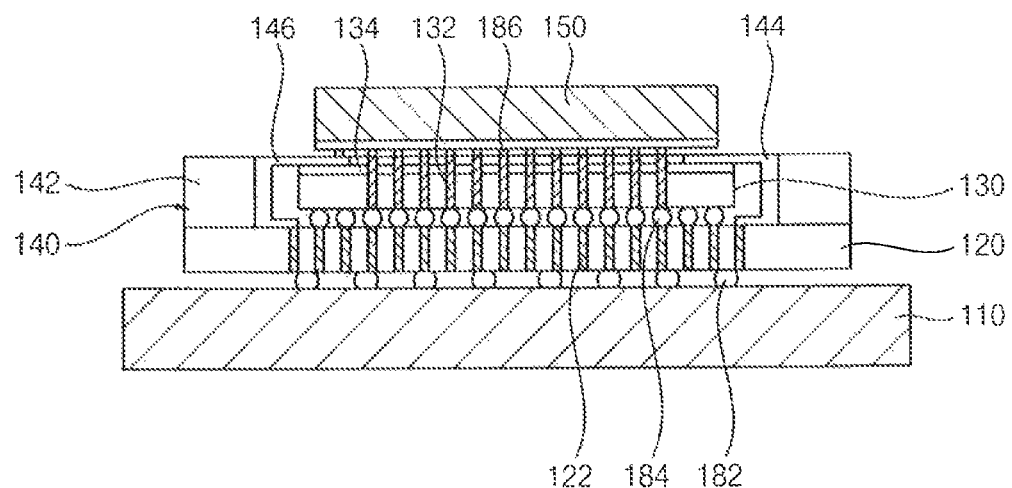

Referring to FIG. 5, the second semiconductor chip 150 may be mounted on the upper surface of the first semiconductor chip 130 using the second conductive bumps 186. The second conductive bumps 186 may electrically connect the pads of the second semiconductor chip 150 with the upper ends of the first plugs 132. The power pad of the second semiconductor chip 150 may be connected to the power line 146 using the second conductive bumps 186.

Figure 6:
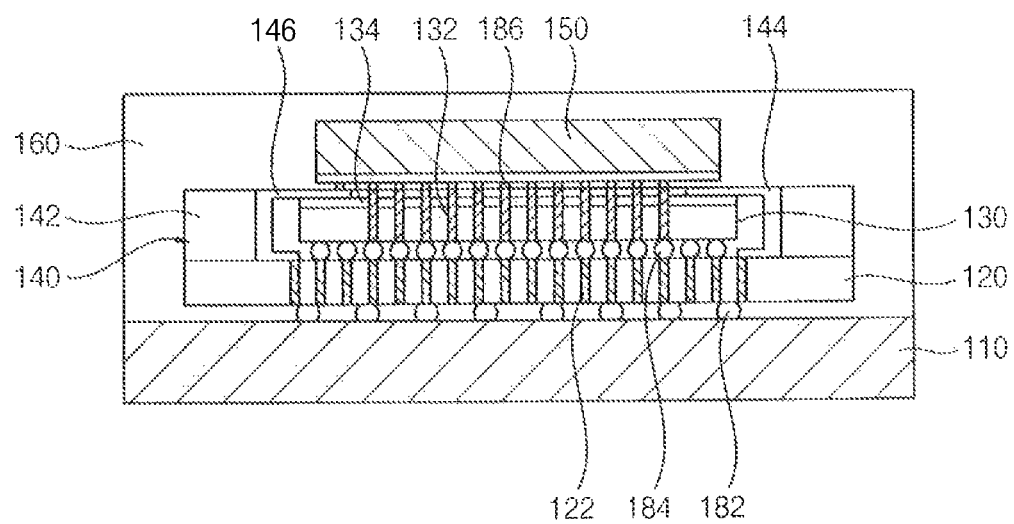

Referring to FIG. 6, the molding member 160 may be formed on the package substrate 110 to cover the interposer chip 120, the thermal dissipation structure 140 and the second semiconductor chip 150.

The external terminals such as the solder balls may be mounted on the lower surface of the package substrate 110 to complete the multi-chip package 100 in FIG. 1.

According to some example embodiments, the thermal dissipating line of the thermal dissipation structure may connect the first semiconductor chip with the interposer chip. Thus, the heat in the first semiconductor chip may be effectively transferred to the interposer chip through the thermal dissipation line. Further, the power line having a sufficient size may connect the power pad of the second semiconductor chip with the interposer chip. Therefore, a sufficient power may be supplied to the second semiconductor chip through the large power line.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-chip package comprising:
a package substrate;
an interposer chip mounted on an upper surface of the package substrate;
a first semiconductor chip mounted on an upper surface of the interposer chip, the first semiconductor chip having a size smaller than that of the interposer chip;
a thermal dissipation structure formed on the upper surface of the interposer chip to surround the first semiconductor chip, the thermal dissipation structure transferring heat in the first semiconductor chip to the interposer chip; and
a second semiconductor chip mounted on an upper surface of the first semiconductor chip,
wherein the interposer chip comprises:
interposer plugs formed through the interposer chip, the interposer plugs having upper ends that electrically make contact with the first semiconductor chip; and
interposer bumps mounted on lower ends of the interposer plugs, the interposer bumps electrically connected with the package substrate.

2. The multi-chip package of claim 1, wherein the thermal dissipation structure comprises:
an insulating layer formed on the interposer chip to surround the first semiconductor chip; and
a thermal dissipation line formed in the insulating layer and configured to make contact with the interposer chip and the first semiconductor chip to form a transfer path of the heat.

3. The multi-chip package of claim 2, wherein the first semiconductor chip has an active region arranged on the upper surface of the first semiconductor chip, and the thermal dissipation line makes contact with the active region.

4. The multi-chip package of claim 2, wherein the thermal dissipation line comprises a metal line.

5. The multi-chip package of claim 1, further comprising:
a power line formed in the thermal dissipation structure to electrically connect a power pad of the second semiconductor chip with the interposer chip.

6. The multi-chip package of claim 1, wherein the first semiconductor chip comprises:
first plugs formed through the first semiconductor chip, the first plugs having upper ends that electrically make contact with the second semiconductor chip; and
first conductive bumps mounted on lower ends of the first plugs, the first conductive bumps electrically connected with the interposer chip.

7. The multi-chip package of claim 1, wherein the second semiconductor chip comprises second conductive bumps electrically connected with the first semiconductor chip.

8. The multi-chip package of claim 1, further comprising:
a molding member formed on the package substrate to cover the interposer chip, the thermal dissipation structure and the second semiconductor chip.

9. The multi-chip package of claim 1, further comprising:
external terminals mounted on a lower surface of the package substrate.

10. A multi-chip package comprising:
an interposer chip;
a first semiconductor chip electrically connected to an upper surface of the interposer chip, the first semiconductor chip including an active region formed at an upper surface thereof; and
a thermal dissipation line extending from an upper surface of the interposer chip to surround a portion of the first semiconductor chip and connect to the active region of the first semiconductor chip to transfer heat in the first semiconductor chip to the interposer chip,
wherein the interposer chip comprises:
interposer plugs formed through the interposer chip, the interposer plugs having upper ends that electrically make contact with the first semiconductor chip; and
interposer bumps mounted on lower ends of the interposer plugs, the interposer bumps electrically connected with a package substrate.

11. The multi-chip package of claim 10, further comprising:
a second semiconductor chip disposed over the active region of the first semiconductor chip and having a power pad thereon; and
a power line extending from an upper surface of the interposer chip to surround a portion of the first semiconductor chip to connect with the power pad of the second semiconductor chip.

12. The multi-chip package of claim 10, further comprising:
a thermal dissipation structure including an insulating layer formed on an upper edge surface of the interposer chip to surround the first semiconductor chip.

13. The multi-chip package of claim 12, wherein the insulating layer comprises a first hole configured to receive the thermal dissipation line therein and a second hole configured to receive the power line therein.

14. The multi-chip package of claim 10, wherein the first semiconductor chip is smaller in cross sectional area than the interposer chip.

* * * * *